(12) United States Patent
Stoller

(10) Patent No.: US 6,765,561 B1
(45) Date of Patent: *Jul. 20, 2004

(54) DISPLAY DEVICE HAVING INTEGRATED CIRCUIT CHIPS THEREON

(76) Inventor: Ray A. Stoller, R.R. #2, Box 1349, Paulding, OH (US) 45879

( * ) Notice: Subject to any disclaimer, the term of this patent is extended or adjusted under 35 U.S.C. 154(b) by 0 days.

This patent is subject to a terminal disclaimer.

(21) Appl. No.: 09/383,768

(22) Filed: Aug. 26, 1999

Related U.S. Application Data

(63) Continuation of application No. 09/001,211, filed on Dec. 30, 1997, now Pat. No. 5,995,088, which is a continuation of application No. 07/964,148, filed on Oct. 21, 1992, now Pat. No. 5,754,171.

(51) Int. Cl.$^7$ ................................................ G09G 5/00
(52) U.S. Cl. ......................................... 345/205; 345/60
(58) Field of Search ................................ 345/204, 205, 345/206, 55, 60, 87; 361/398, 400, 403; 228/180.1, 180.2; 257/785; 439/71; 357/74

(56) References Cited

U.S. PATENT DOCUMENTS

| | | | | |
|---|---|---|---|---|
| 3,668,688 A | * | 6/1972 | Schmersal | |
| 3,684,918 A | * | 8/1972 | Schmersal | |
| 4,145,120 A | * | 3/1979 | Kubota | |
| 4,597,617 A | * | 7/1986 | Enochs | 361/398 |
| 4,613,855 A | * | 9/1986 | Person et al. | |
| 4,677,458 A | * | 6/1987 | Morris | 439/71 |
| 4,887,760 A | * | 12/1989 | Yoshino et al. | 228/180.2 |
| 4,949,147 A | * | 8/1990 | Bertelink | 357/74 |
| 4,998,665 A | * | 3/1991 | Hayashi | 228/180.1 |
| 5,015,191 A | * | 5/1991 | Grabbe et al. | 439/71 |
| 5,754,171 A | * | 5/1998 | Stoller | 345/205 |
| 5,995,088 A | * | 11/1999 | Stoller | 345/205 |

OTHER PUBLICATIONS

Circuits Assembly Magazine, pp. 25–33, May 1991.*
"Bumps", ICP–TP–682. p23.*
"Active & Passive Base Device Interconnections", Electron Packaging, 2–pgs, Dec. 1989.*
"Assembly Process Comparison", 7–pgs, 1992.*

* cited by examiner

Primary Examiner—Regina Liang

(57) ABSTRACT

A flat panel having at least one non-conductive substrate having a first conductor array on the surface thereof and a dielectric layer on said first conductor array having an exposed flat surface. A first predetermined pattern of vias external through the dielectric layer to pads on each conductor in the array. A second predetermined pattern of vias extend through the dielectric layer to further conductive pads, and an input and through-feed second conductor array is on the substrate with the dielectric layer covering the second predetermined pattern. A conductor material, preferably a gold frit, is in contact with the conductor at the bottom of each via, respectively, and partially filling same to a predetermined level below said exposed flat surface. An integrated circuit chip having an array of a conductive input/output bumps arranged to be congruent with the first and second predetermined patterns is clamped in contact with the conductor material in said vias with a predetermined pressure to make a gas tight contact joints.

11 Claims, 4 Drawing Sheets

DISPLAY DEVICE HAVING INTEGRATED CIRCUIT CHIPS THEREON

CROSS REFERENCE TO RELATED APPLICATIONS

The present application is a continuation of Ser. No. 09/001,211 filed Dec. 30, 1997 now U.S. Pat. No. 5,995,088, which is a continuation of Ser. No. 07/964,148, filed Oct. 21, 1992 now U.S. Pat. No. 5,754,171.

BACKGROUND AND BRIEF DESCRIPTION OF THE INVENTION

The invention relates to cross-point matrix display devices and, more particularly, to flat cross-point matrix display devices having integrated circuit chips thereon, and, still more particularly, AC gas discharge display and memory panels having integrally associated driving circuits.

There are numerous types of flat panel cross-conductor matrix display devices using gaseous discharge mediums (AC and DC types), liquid crystal display mediums, and electroluminescent mediums. A typical example of a gas discharge display panel of the type with which the present invention is concerned is disclosed in Baker et al. U.S. Pat. No. 3,499,167 which is incorporated herein by reference. Integrating solid-state addressing circuits and chips with edge extensions on such panels is likewise well known in the art as disclosed in Schmersal U.S. Pat. No. 3,668,688. An example of a flat direct current (DC) dot matrix plasma display panel with integrated circuit (IC) chips on edge extensions is found in Person U.S. Pat. No. 4,613,855. An example of a liquid crystal display is given in Kubota U.S. Pat. No. 4,145,120 and, an example of thin-film electroluminescent display panel drive is shown in Fujioka et al. U.S. Pat. No. 4,983,885. A gas discharge display/memory panel with selection and addressing circuits incorporated on edge extensions of the panel wherein the dielectric coatings on the conductors in the active area of the panel are extended a distance beyond the spacer sealant and holes or vias are formed in the dielectric which contains circuit components is illustrated in Schmersal U.S. Pat. No. 3,684,918.

Thus, the present invention is directed to improvements in flat panel display systems and, more particularly, to improvements in the electromechanical-physical aspects of integrated circuit chips and their coupling to such display panels.

According to the invention, gold bump-type dies (integrated circuit chips) are inserted in self-aligning dielectric fixtures or micro-sockets integrally formed with the glass panel structure and directly in contact with a panel electrode and input circuit traces for the driver integrated circuit chips. Holes or vias are formed in edge extensions of a thin glass dielectric layer down to thin film electrodes and electrode patterns on a non-conductive substrate. The holes are filled to form a thick film pad by back-filling same with conductive gold frit to a predetermined distance from the top of the dielectric hole or via, then the die or flip chip with gold bumps thereon are inserted in the micro-sockets thus formed and clamped in place.

According to one aspect of the invention, the display panel has thin-film circuit traces and chip input/output pad patterns added around the panel periphery at the same time as the panel electrodes are added or formed with vacuum deposition and photolithography. Then a thin layer of dielectric glass is screen-printed onto the panel covering the thin film electrodes and circuit traces.

In a preferred embodiment, the dielectric glass is the same dielectric glass used in an AC plasma display panel but, it will be appreciated that other non-conductive glasses or insulators can be applied over the circuit tracers or patterns of liquid crystal and/or electroluminescent panels and processed as described earlier. In the case of the AC gas discharge display panel, the glass dielectric is then selectively etched using well known etching techniques which have been developed for etching barrier structures in AC plasma displays. The selectively etched cavities form vias (holes or feed-throughs) from the surface of the dielectric glass to the thin film pad patterns at the chip and at the edge connections for input signals and feed-throughs between chips where high voltage pulses and pulse current grounds can be routed.

Further, in a preferred embodiment, the glass dielectric covering extends to the edge of the glass panel and on top of the glass dielectric layers are screened-printed thick film conductive pads to accept external interconnect cable pads. The thick film pads extend over the vias and fill them up to create a connection from the external cable (flex circuit) over to the chip's pads. The thick film pads can be extended into the circuit traces which cross over other signal paths (under the dielectric glass) to feed-throughs which are filled up with the thick film conductors to complete a connection from the external cable to the chip's pads. The thick film gold referred to herein is applied as a paste although also containing a glass frit material. The paste is fired after application to the panel and the thick film conductor structure essentially becomes fused into and integral with the panel structure thus sealing the thin film conductors from contamination by ambient conditions.

The vias at the chip's pads are backfilled with thick film gold to a height which allows the chip bumps to settle into a detent when it is precisely in a correct mounting position. The detent holds the chip in the X, Y position, even in demanding shock and vibration environments. In the Z direction (e.g., perpendicular to the plane of the panel), an appropriate force will be asserted by wire spring clips which clamps around the edge of the panel. The flip chip on-glass devices which are mechanically clamped in place can be readily removed for service or when defective or to upgrade the drive chips.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1A:
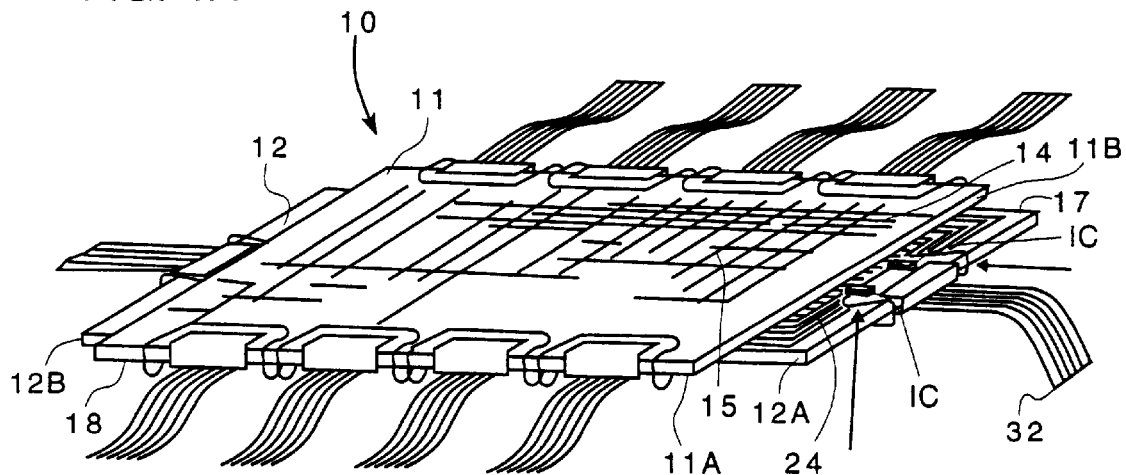
FIG. 1A is an isometric view of a flat display panel incorporating the invention.

Referring now to the drawings, since the invention is primarily directed to the electro-mechanical-physical aspects of display panels, the electronic theories of operation for the different technologies involved (gas discharge, liquid crystal, electroluminescent) are avoided. However, where necessary, electronic discussions are included in some of the following discussion.

As shown in FIG. 1A, a display panel device 10 which may be AC gas discharge, DC gas discharge, electroluminescent, or liquid crystal but, in this preferred disclosed embodiment is an AC plasma discharge device (AC plasma display panel (PDP)) having a pair of non-conductive substrates, typically glass plates 11 and 12 which have linear conductor arrays 14 and 15 thereon which are coated with one or more dielectric layers 17 and 18 and joined in spaced apart relation by a sealant 19 with a gaseous discharge medium sealed therein. One or both panels may have spacer ribs or barriers (not shown) formed thereon.

Figure 5:
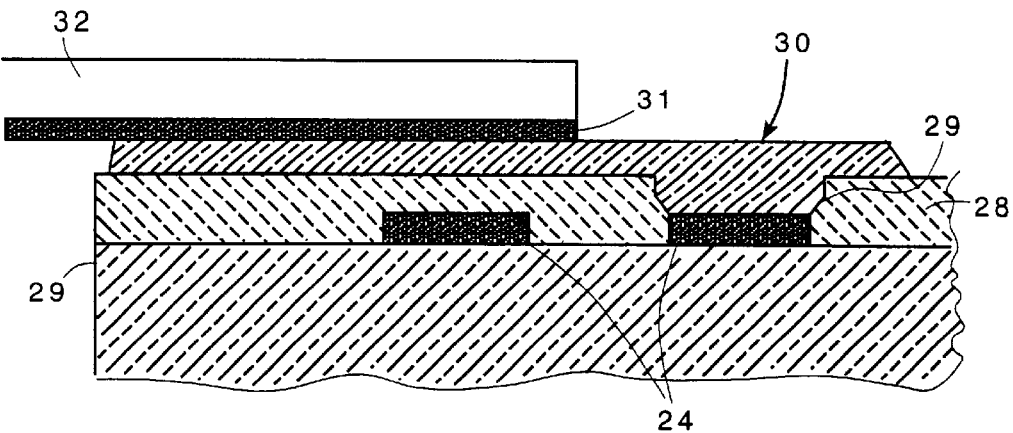
FIG. 5 is an enlarged sectional view of the flex circuit connections to the display device of FIG. 1.

Plates 11 and 12 are provided with edge extensions 11A and 11B and 12A and 12B, extending beyond the lateral edges of their respective opposing plates 12 and 11 and alternate electrodes (odd and even) are extended onto the edge extensions and have termination points or pads 25 arrayed in a predetermined pattern (see FIG. 3) corresponding to a predetermined pattern of conductive "bumps" 36 on integrated circuit chip IC. In FIG. 1A, two bumped integrated driver chips IC are on each end 12A and 12b. If each can accommodate 32 output lines for 32 of the electrodes on plate 12, the four IC's drive 128 lines on the panel. Input power, clock, and data signals and feed-throughs to the chips IC are received from externally of the panel by screen-printed conductive pads 25S on the plate surfaces which are connected to circuit leads to a further pattern of pads 25P which holes 29 etched in the dielectric layers. As discussed later in connection with FIG. 5, thick film pads 30 extend over the holes or vias 29 to fill them up to create a connection from the external flex cable 32 to the chip pads 25S.

Figure 2:
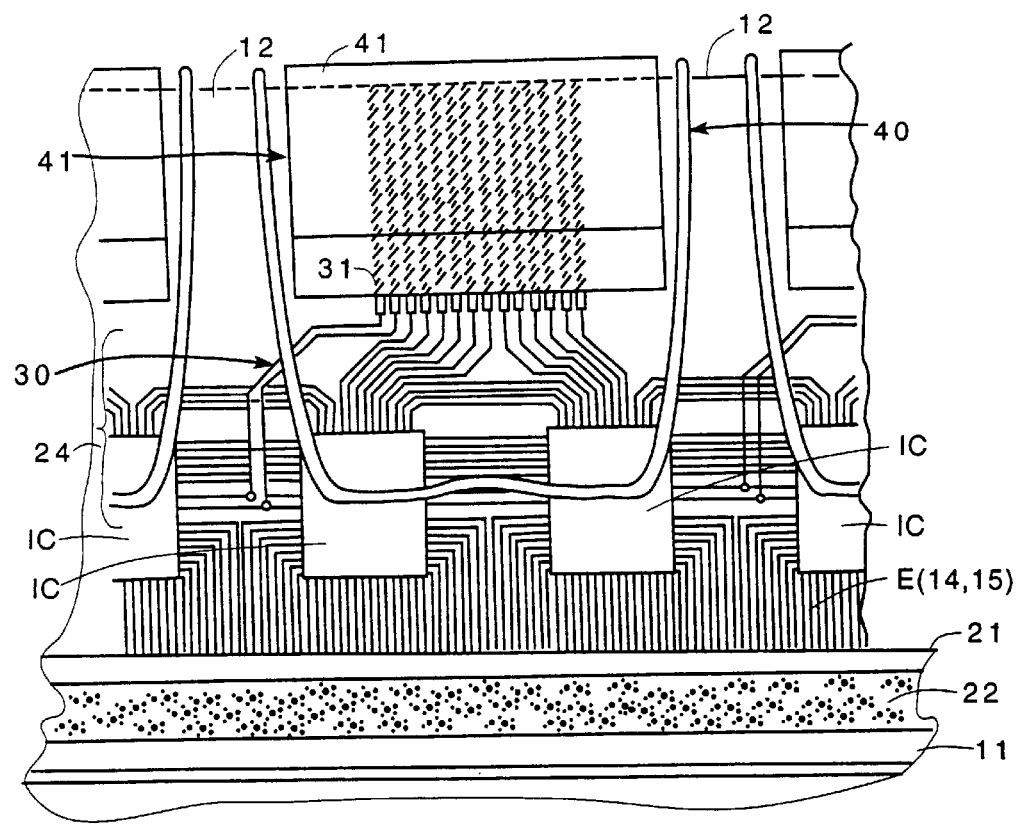
FIG. 2 is an enlarged plan view of the edge of a flat AC plasma display panel incorporating the invention.
Figure 3:
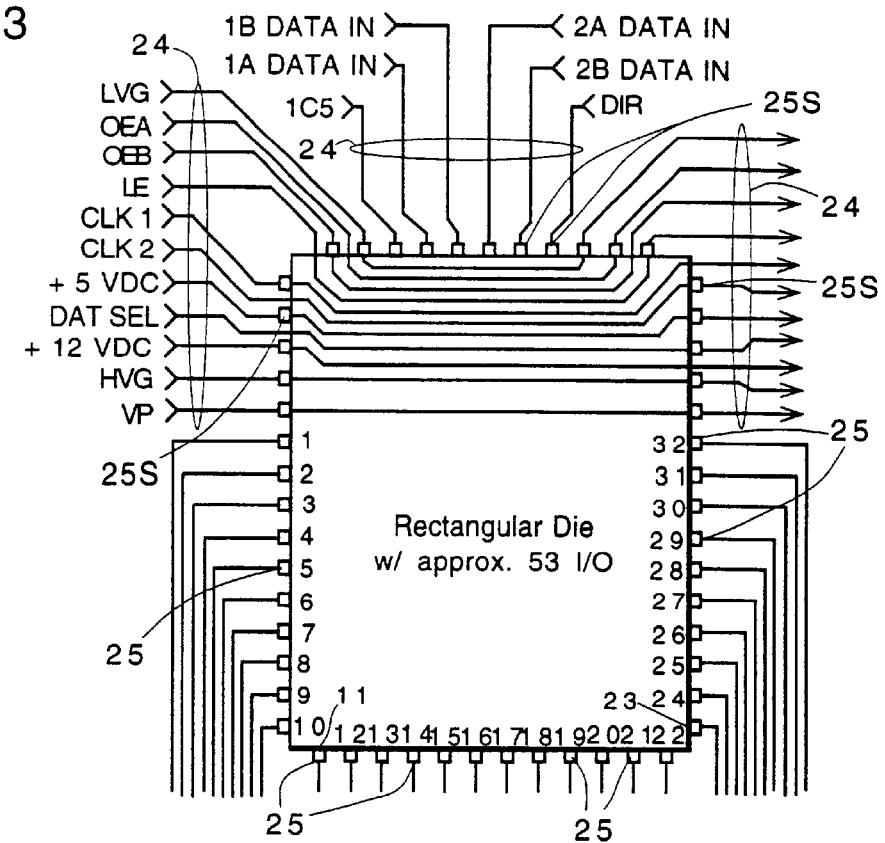
FIG. 3 is a further enlarged top plan view of a chip or die element shown in FIG. 2.

Referring to FIG. 2, an enlarged portion of an edge extension 12A of plate 12 is shown which extends beyond the edge 21 of viewing plate 11. It will be appreciated that the edge extension 12A is essentially the same for both the upper and lower substrates 11 and 12 and that in conventional fashion, the arrays of panel electrodes extend outwardly from the display or beyond the seal area 22 and the edge 21 on the opposing panel. The electrode array extension shown in FIG. 2 is provided with chip input/output pad pattern 25, 25S which are set out in a pattern shown in the enlarged view of FIG. 3. In FIG. 3, the output pad pattern 25 is to accommodate 32 panel conductors (the pads 25 are numbered 1 through 32) and the pattern 25S accommodates the power, input data, feed-through, etc. inputs to the chip.

Figure 1B:
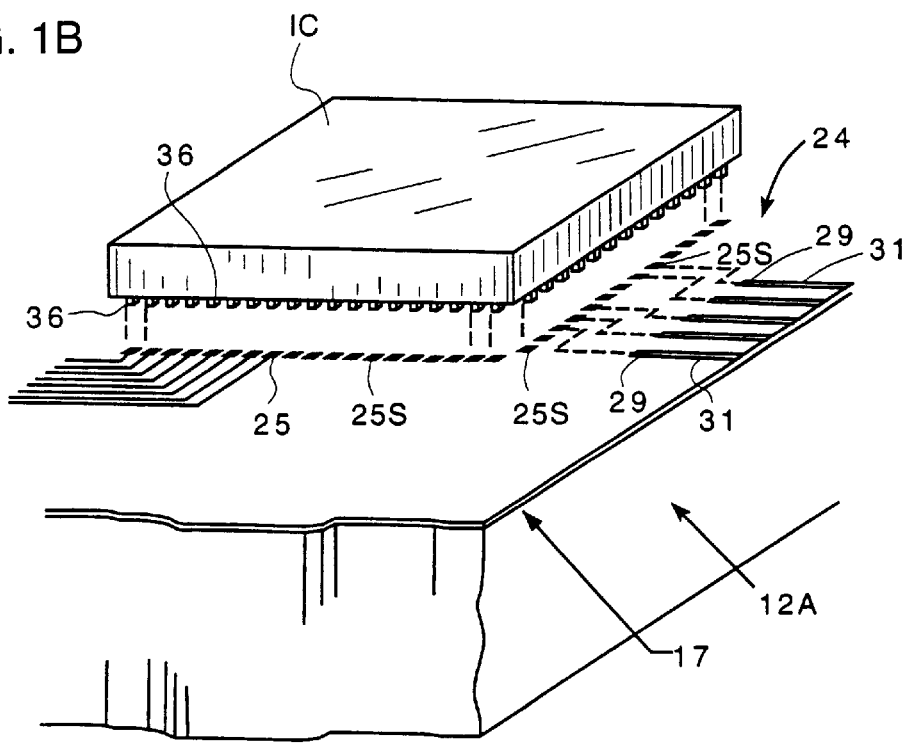
FIG. 1B is an enlarged diagrammatic view of a portion of a panel incorporating the invention.

The display panel has thin film circuit traces 24 and chip I/O pad patterns 25, 25S added around the panel periphery at the same time as the panel electrodes E are added with vacuum deposition and photolithography. A thin layer of dielectric glass 28 is screen-printed onto the panel covering the thin film electrodes E (14, 15, FIG. 1) and circuit traces 24. The dielectric glass is then selectively etched to form cavities 29 to form vias (feed-throughs) from the surface of the dielectric glass to the thin film pad 25, 25S patterns at each chip IC location and at the edge connections for input signals and at feed-throughs between chips where high voltage pulses and pulse current grounds can be routed. Known etching techniques as disclosed in Knauer et al. U.S. Pat. No. 4,827,186 can be used.

The glass dielectric covering 28 extends to the edge 29 of the glass panel. On top of the glass dielectric layer are screen printed thick film conductive pads 30 to accept pad 31 on flexible external interconnect cables 32. The thick film pads 30 extend over the vias and fill them up to create a connection from the external cable 32 (flex circuit) over to the chip's pads. The thick film pads 30 can be extended into circuit traces which cross over other signals (under the dielectric glass) to feed-throughs 29 which are filled up with the thick film conductors to complete a connection from an external cable to the chip's pads. Note that the thick film gold referred to herein is applied as a paste also containing glass frit material. The paste is fired after application to the panel and the thick film conductor essentially becomes fused into (integral with) the panel structure.

Figure 6:
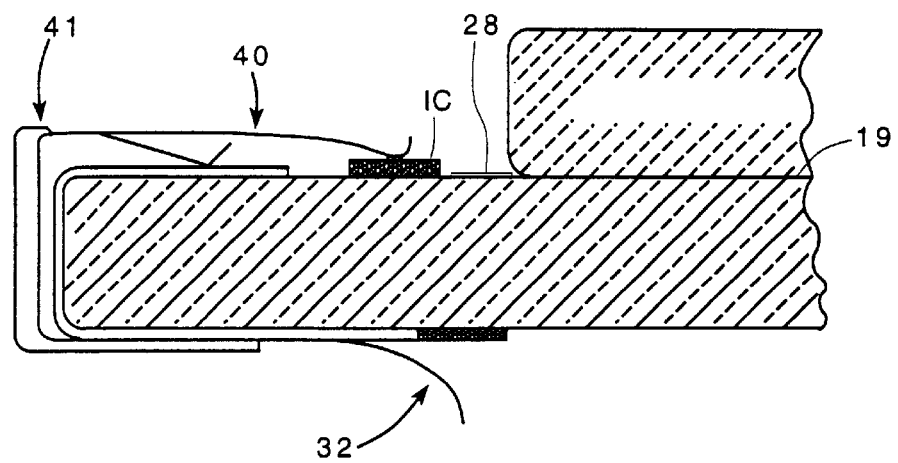
FIG. 6 is a sectional view of the edge connector arrangement shown in FIG. 2.

The etched holes in the dielectric or vias 29 at the chip's pads 25 are backfilled with thick film gold 35 to a height which allows the IC chip bumps 36 to settle into a detent when it is precisely in the correct mounting position. In this respect it will be noted that the bumps and hole patterns, preferably, are not symmetrical, which precludes improper insertion of an IC chip in the dielectric micro-sockets. Various well known guide and automatic chip alignment may be used in the assembly operation. This detent holds the IC flip chip in X-Y position even in demanding shock and vibration environments. In the Z direction, an appropriate force is asserted as indicated in FIGS. 2 and 6 by a "wire" spring clip 40 (with force spreader to be determined) which clamps around the edge of the panel. As shown in FIG. 2, two chips or more chips can be added with one clip which can straddle one external cable to connect with the same two chips. This approach is more dimensionally viable for the spring clips and the external cables. It also reduces by half or more the number of external cables to the panel in some drive schemes where it is necessary to employ parallel data, ground and/or voltage pulse paths to each of all drivers along a side of a panel. As shown in FIG. 6, flex cable 32 is folded over the edge extension and pressed by clamp 41 into contact with thick film pads 30.

Figure 4:
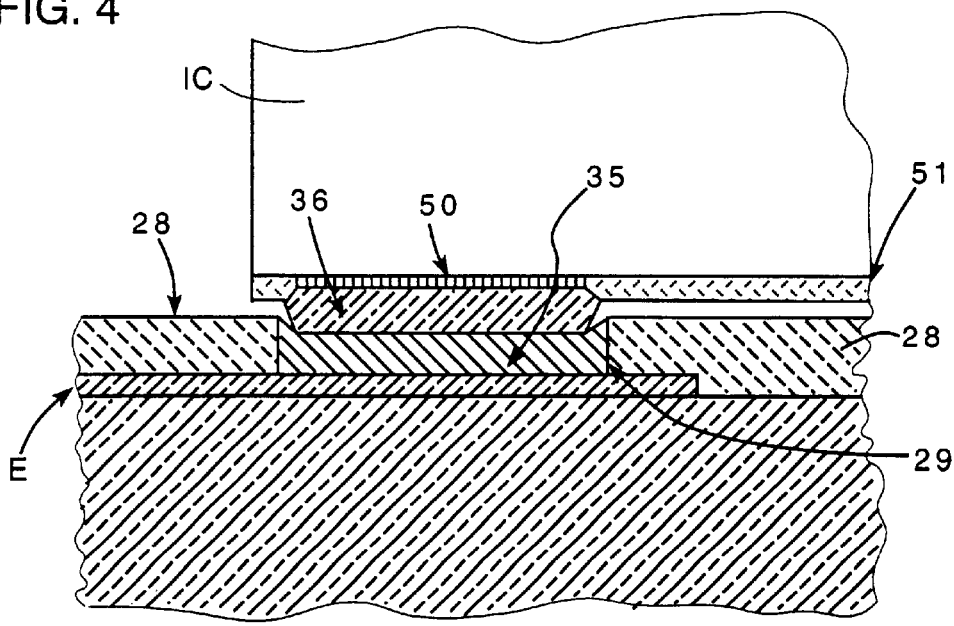
FIG. 4 is a greatly enlarged sectional view of the electrical connections made according to the invention.

The flip chip IC devices are mechanically clamped into place so they can be readily removed when defective or for upgrading, etc. Since the clamp 40 straddles external cables, chip insertion and removal can occur without disturbing the cable connections. A rework compatible conformal coating (silicone based (not shown)) common to sealing other circuit assemblies can be applied to the panel assembly. Note that the flex circuits may be anisotropically bonded to the panel instead of mechanically clamped by clamp 41. As shown in FIG. 4, the die/flip chip IC typically has a titanium and tungsten input/output (I/O) pad 50 surrounded by a glassivation or insulating layer 51 and a 10 micron gold bump 35 which may be approximately 4.5×4.5 mils square depends therefrom. The thick film pad 35 is backfill controlled to 5 microns from the top of dielectric cavity 29.

Instead of a clamp, it is contemplated that the requisite pressure can be applied by a pressure plate or cap of ceramic or glass material which is placed on and overhangs the chip IC. An adhesive is used to hold the plate or cap on the IC chip to thereby apply the requisite pressure on the bumps. This can also be used to seal the IC.

A further advantage of the invention is that the IC chip can be dynamically tested with the panel and temporarily held in place in the micro-sockets prior to applying a more permanent clamping.

The precise control and high resolution capability of the etching process can readily yield perfect micro-sockets compatible with gold-bumped flip chip ICs.

Flip Chip Contact Reliability

It is generally recognized that forces of 100 to 150 grams are sufficient for penetrating resistive surface films generated in an industrial environment. It is less clear, that these forces are sufficient to prevent the growth of contaminating films between the contacting surfaces after many years of service. Highly reliable connections have been routinely achieved with forces of around 10,000 psi by clamping gold dots or bumps on flex circuits to gold plated conductor pads on printed circuits. The high contact force creates a "gas tight" joint similar to that of a standard crimp barrel termination for connector contact to wire terminations. The high contact pressures are achieved by a low axial load transformed into high force due to the small cross-sectional area of the contact surface. The so-called gas tight joint is the point of contact at which contaminating film cannot form due to the high force. At this force, a microscopic flow of gold occurs between the surfaces to equalize their contact anomalies and create a gas tight joint.

In the present invention, the very small cross-sectional area of the gold bumped I/O pads 25 requires only a couple pounds of axial force on the chip IC to result in several thousands psi pressure at the gold bump 36 contact points. This Z-axis force, in addition to the tight X and Y axis fixturing of the chip, and the conformal coating seal over the assembly, prevents contamination build-up at the contacts. The bumped die integral multilayer structure at the I/O pad 25 is quite durable in terms of the forces that can be exerted without breaking the chip. Thermocompression bonding at the inner lead bond results in forces of 200 grams at the I/O pads. This is a pressure of around 20,000 psi. In addition, strength is tested by pull and shear forces of 50 and 100 grams respectively, again pointing to pressure capabilities of several thousands psi at the bumped die I/O pads 25.

Sealing the Panel

The above described display panel with flip chip IC assembly based on gold pads including flex circuitry interconnect will withstand the most demanding environments (including high moisture) of MIL-STD-910E. The gold bumping process seals the exposed pad areas of the glassivated die. Gold bumped die are integrated into TAB which has been tested for moisture resistance in accordance with MIL-STD-910E with good results. Note that the seals in question are not the gold bump interface or the die itself for TAB application in high humidity, but are the inner lead bonds (ILB) and outer lead bonds (OLB) which are onto 35 micron copper foils.

In the art, bumped chips are considered hermetically sealed, including as a result of demanding environmental testing. It is known and has been further shown in environmental testing that a thin chip-coat encapsulation layer provides additional protection to the passivated chip to eliminate failures due to moisture and ionic contamination. A "glob" top coating, with thickness typically 20 to 50 mils was found to be unacceptable for TAB due to the lack of dimensional flow control and to the large thermal stresses induced on the device. Controlled top coatings on the order of 10 Mils did yield good environmental resistance results and provided mechanical scratch protection for the hermetic passivation layer of the bare chip.

Encapsulation of a contaminated chip surface could lead to severe reliability problems. Ionic species present on the surface in the presence of moisture can migrate between conductors (bumps) or through defects in the surface of the passivation layer. These migrating ions can cause electrical shorting or corrosion. A small percentage of ionic species will always be present in the system, but if moisture is unable to pool in any areas, the damage caused by these ions will be reduced or eliminated. Accordingly, the present invention assembly process for the flip chip on glass display panels are performed in a clean-room, and the surface cleaning preparation will be based on an tonically pure cleanser and dryer.

Conformal coating are silicone based per MIL-I-46058C for assemblies and electronics that will be subjected to hostile environments and rugged uses such as marine, aerospace and military applications. Humidity, in conjunction with ionic contaminants that form conductive solutions (which in turn produce unwanted conductive paths) is generally recognized as the most damaging and prevalent contaminant affecting printed circuit performance. In non-hermetic insulators, excessive humidity can drastically reduce insulation resistance between conductors and accelerate high-voltage breakdown. Selection of a conformal coating should be based on resistance to moisture or contaminants.

Contaminants include residues of manufacturing processes, such as flux residues, cleaning solvents, release agents, depositions from human handling (i.e., fingerprints, body greases, cosmetics, foodstuffs), as well as ambient environment (salt spray, dust, fuel and other machine fluids, corrosive vapors, fungi). In addition, the cured conformal coating should not shrink excessively during curing, which can exert mechanical stresses on delicate components. When cured, the conformal coating should become a long-lived, effective barrier against moisture and airborne contaminants, provide good electrical insulating properties over its temperature operating range, be resistant to certain chemicals, remain flexible to absorb thermal shocks without cracking and be repairable.

Silicone conformal coatings stack up very well in general for electronics assemblies against acrylic, polyurethane and epoxy.

They provide excellent thermal endurance and are very resistant to humidity and corrosion. They are not solvent-soluble and do not vaporize with heat which makes them effectively removable and/or reworkable only by mechanical means. Replacement of chips after conformal coating is believed to be relatively easily performed with an appropriate knife blade to scribe and peel the coating away at room temperature.

Silicone does have a high thermal coefficient of expansion which must be taken into account as a stress to components encapsulated between the conformal coating and the substrate.

Silicone is considered one of the more suitable non-hermetic sealants for use with bumped chips going into TAB. In comparison to unfilled and filled epoxies (used in standard integrated circuit packages), silicone has less ionic impurities (chloride ion under 5 ppm versus up to 20 ppm for filled epoxy semiconductor grade molding compound) and alpha particle protection is also good. Compared to polymides, silicone also has less ionic impurities (polymides have chloride ion under 10 ppm) and has similar alpha particle protection. All 3 of these materials are used in TAB because their typical coating thicknesses (a few Mils to less than 20 Mils) can be readily controlled.

In small flat panel displays (512H×256V and 640H×480V binary monochrome), a high degree of bussing logic signals including input power distribution between chips without crossovers can be achieved with standard driver ICs such as available from Supertex and Texas Instruments. In addition, the outputs of these ICs can be connected to the panel electrodes without interleaving or crossovers. As such, these panels can be built and operated with only one metallization layer and four connectors, one for each side of the panel. However, as gray scale operation, multiple colors and high line numbers are added to the displays, parallelism in data paths and power signal distribution to the chips must be accommodated.

For example, a conceptual driver IC die configuration is shown in FIG. 2 for driving up to 2048H×1080V full color plasma displays. Pinout of the IC is such that there are no crossovers in connections to the panel electrodes, and there are no crossovers in connections to panel edge pads where external interconnect cables can be attached. In addition, the cumulative currents flowing through the IC drivers result in high instantaneous peak power in the high voltage pulse (VP) and associated ground return (HVG) busses which would be impractical to provide as singular circuit traces on the glass panel periphery common to all of the flip chip IC's on a side.

IC pinout arrangement shown in FIGS. 2 and 3 brings the data input signals including high voltage and ground signals to the IC directly from external interconnect.

There are a number of 5V logic level signals shown in FIGS. 2 and 3 which can be commonly bussed to all driver ICs on a side of the panel. In addition, several signals are arranged to allow direct connection to other signals at the IC's pads as appropriate in certain applications. In any case, the conceptual IC pinout in flip chip on glass display panel application reduces the number of interconnections per conceptual driver IC to the panel from 32 to 7. In addition, resolution of the interconnect cables is reduced so that their manufacturing and integration costs are lower. The designations shown in FIG. 3 are merely exemplary.

The high voltage pulse VP and ground signals (VG, HVG, etc.) must be provided to the IC as inputs to the center of both sides just above where the outputs to the panel are located. This avoids large internal busses inside the IC which are space consuming and costly. However, this requires that the high voltage pulse and associated ground signals crossover the bussed signals between ICs as shown in FIG. 2. This is not a difficulty.

The above example illustrates the extendibility of the invention to a complicated drive scheme relative to any display technology. Note that EL displays and LCD panels will need to incorporate such drive complication when their speed and power is increased to address gray scale, multiple colors and high line count. Also note that the FIG. 2 example is scaled to drive a 200 lines per inch resolution in the display panel.

For EL display and LCD panels, processing of their substrates to incorporate the invention's FCOG approach must occur before their active mediums are deposited. In addition, there will need to be glass dielectric coating material matches made to the particular substrate glass material used in each technology. Note that the thin film metal patterning will be different in each of the technologies, but this should not impede processing of vias and the micro-sockets, nor should it present any mismatch to the thick film gold backfill and pad processing.

While the invention has been shown and described in relation to a preferred embodiment, it will be appreciated that other embodiments and adaptations of the invention will be readily apparent to those skilled in the art.

What is claimed is:

1. In a crossed conductor matrix display panel having a pair of linear conductor arrays with said linear conductor arrays being oriented relative to each other to define said crossed conductor matrix and an electro-responsive display medium located at each matrix cross point, at least one substrate means having spaced side edges, lateral edges projecting beyond said spaced side edges, signaling conductor means on said lateral edges, said signaling conductor means being connected to each conductor in said array, respectively, and semiconductor circuit means mounted on said lateral edges and connected to interconnect conductor means to supply operating potentials to said conductor arrays, the improvement wherein said interconnect conductors have dielectric coating having the surface thereon and means forming a plurality of cavities in said dielectric in a predetermined pattern, an in-situ formed conductor means filling said cavities to a predetermined distance below said outer surface, said dielectric layer, cavities and conductor means forming a hermetically sealed micro-socket integral with said panel, said semiconductor circuit means including at least one die, conductive bump means on said die connecting to circuitry in said die and being in said predetermined pattern and receivable in and positioned by said plurality of cavities, and means for retaining said die on said lateral edges with said bump means in said cavities contacting said conductor means in said cavities with a pressure sufficient to form a gas tight joint at the point of contact.

2. In a flat panel display having at least one non-conductive substrate having a first conductor array on said surface, and a dielectric layer on said first conductor array having an exposed flat surface, the improvement comprising a first pre-determined pattern of vias through said dielectric layer to pads on each conductor in said array, a second pre-determined pattern of vias through said dielectric layer to further conductive pads, and an input and through-feed second conductor array on said substrate with said dielectric layer covering said second pre-determined pattern, and a conductor material in contact with the conductor at the bottom of said via and partially filling the same to a predetermined level below said exposed flat surface, an integrated circuit chip having an array of conductive input/output bumps arranged to be congruent with said first and said second predetermined pattern, and clamp means for clamping said bumps in contact with said conductor material in said vias with a predetermined pressure.

3. The invention defined in claim 2, wherein said conductor material is conductive gold frit.

4. The invention defined in claim 2, wherein there are a plurality of said first and second pre-determined pattern of vias and conductor material in each via, and a common clamp means for at least two of said integrated circuit chips.

5. The invention defined in claim 4, wherein said conductive bump means has an outer precious metal surface.

6. The invention defined in claim 2, wherein there are a plurality of hermetically sealed micro-sockets simultaneously formed integrally with said panel.

7. The invention defined in claim 2, wherein said fired conductor means is a fired precious metal conductor frit.

8. The invention defined in claim 2, wherein said clamp means is a spring clip which exerts a predetermined pressure on said integrated circuit chip.

9. In a flat display panel having at least one non-conductive substrate having a first conductor array on said surface and a dielectric layer on said first conductor array having an exposed flat surface, the improvement comprising, a first predetermined pattern of vias through said dielectric layer to pads on each conductor in said array, a second predetermined pattern of vias through said dielectric layer to further conductive pads, and an input and through-feed second conductor array on said substrate with said dielectric layer covering said second predetermined pattern, and an in-situ formed conductive gold frit conductor material in contact with the conductor at the bottom of each of said via and partially filling the same to a predetermined level below said exposed flat surface, an integrated circuit chip having an array of conductive input/output bumps arranged to be congruent with said first and second predetermined pattern, and clamp means for clamping said bumps in contact with said conductor material in said vias with a predetermined pressure, said clamp means, including a pressure plate adhered to the substrate and extending over the integrated circuit, thereby clamping said bumps in contact with said conductor material with the requisite predetermined pressure.

10. The invention defined in claim 9, wherein there are a plurality of said first and second predetermined pattern of vias and conductor material in each via, and a common clamp means for at least two of said integrated circuit chips.

11. The invention defined in claim 10, wherein said conductive bump means has an outer precious metal surface.

* * * * *